United States Patent [19]

Tsubakihara

[11] Patent Number: 5,727,955
[45] Date of Patent: Mar. 17, 1998

[54] SOCKET FOR ELECTRONIC COMPONENTS AND ELECTRONIC COMPONENT WITH SOCKET FOR CONNECTION

[75] Inventor: Hidehiro Tsubakihara, Osaka, Japan

[73] Assignee: Sumitomo Metal Industries Limited, Osaka, Japan

[21] Appl. No.: 719,977

[22] Filed: Sep. 24, 1996

[30] Foreign Application Priority Data

Oct. 2, 1995 [JP] Japan ................................. 7-255261

[51] Int. Cl.$^6$ ................................................. H01R 9/09
[52] U.S. Cl. ........................................ 439/71; 439/67
[58] Field of Search ............................ 439/71, 72, 73, 439/67, 68

[56] References Cited

U.S. PATENT DOCUMENTS

| | | | |
|---|---|---|---|
| 4,783,119 | 11/1988 | Jamison et al. | 439/68 |
| 4,917,613 | 4/1990 | Kabadi | 439/67 |
| 4,954,878 | 9/1990 | Fox et al. | 439/68 |
| 5,109,320 | 4/1992 | Bourdelaise et al. | 439/68 |
| 5,176,524 | 1/1993 | Mizuno et al. | 439/73 |
| 5,205,741 | 4/1993 | Steen et al. | 439/73 |
| 5,273,440 | 12/1993 | Ashman et al. | 439/71 |
| 5,302,853 | 4/1994 | Volz et al. | |
| 5,313,368 | 5/1994 | Volz et al. | 361/774 |
| 5,322,446 | 6/1994 | Cearley-Cabbiness | 439/73 |
| 5,383,787 | 1/1995 | Switky et al. | 439/67 |
| 5,389,820 | 2/1995 | Matsuoka | 439/68 |
| 5,406,025 | 4/1995 | Carlstedt | 174/17 |
| 5,407,361 | 4/1995 | Ikeya | 439/72 |

FOREIGN PATENT DOCUMENTS

| | | |
|---|---|---|
| 63-305536 | 12/1988 | Japan . |
| 64-86540 | 3/1989 | Japan . |
| 64-89549 | 4/1989 | Japan . |
| 6-504880 | 6/1994 | Japan . |
| 6-308194 | 11/1994 | Japan . |

*Primary Examiner*—Neil Abrams
*Assistant Examiner*—T. C. Patel
*Attorney, Agent, or Firm*—Burns, Doane, Swecker & Mathis, LLP

[57] ABSTRACT

A socket for electronic components for electrically connecting an electronic component with an electronic circuit substrate. The socket has a frame for engaging the electronic component; a film-shaped connector which is retained by the frame and which has a first terminal to be connected to the terminal of the electronic component, a second terminal to be connected to the terminal of the electronic circuit substrate, and a wiring for electrically connecting the first terminal with the second terminal corresponding to the first terminal; and a cover mounted on the frame, for covering the electronic component, to make the terminal of the electronic component come into contact with the first terminal.

12 Claims, 10 Drawing Sheets

SOCKET FOR ELECTRONIC COMPONENTS AND ELECTRONIC COMPONENT WITH SOCKET FOR CONNECTION

BACKGROUND OF THE INVENTION

1. Field of the Invention

The present invention relates to improvements in a socket for electronic components to mount an electronic component such as a multi-chip module or the like on an electronic circuit substrate.

2. Description of Related Art

Conventionally a hinge type of socket or a connector was used to detachably mount on the electronic circuit substrate the electronic component such as the multi-chip module or the like.

Figure 1:
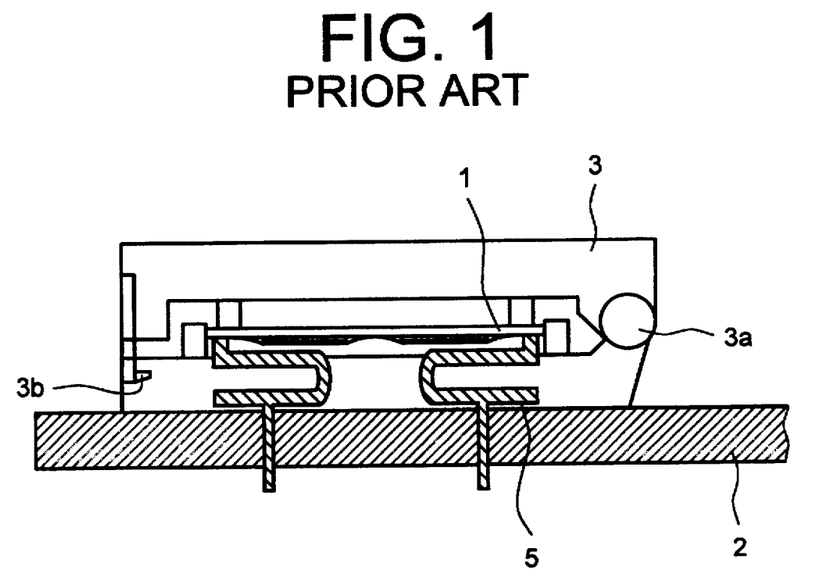
FIG. 1 is a sectional view showing a conventional example where a multi-chip module is mounted on an electronic circuit substrate with the use of a hinge type of socket.

FIG. 1 is a sectional view in an example where a multi-chip module 1 is mounted on an electronic circuit substrate 2 with use of a hinge type of socket 3. The hinge type of socket 3, fixed to the electronic circuit substrate 2, is provided with terminals of the electronic circuit substrate 2 whose tip ends are formed on contact pins 5 so as to come into contact respectively with each terminal of the multi-chip module 1. The hinge type of socket 3, free to open and close around a support point 3a, is engaged by a pawl 3b in a depressed condition of the multi-chip module 1 so that each terminal of the multi-chip module 1 may come into contact respectively with the corresponding contact pin 5.

Figure 2:
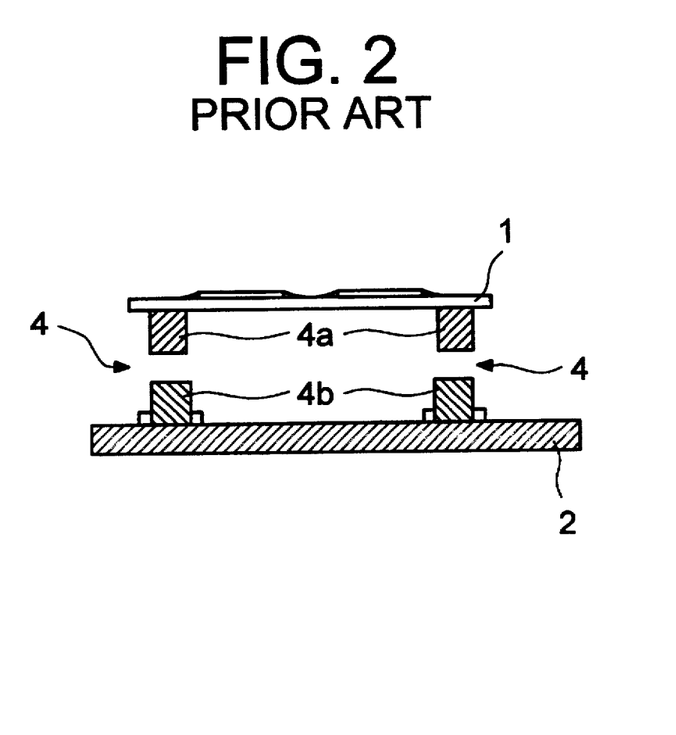
FIG. 2 is a sectional view showing a conventional example where the multi-chip module is mounted on the electronic circuit substrate with the use of a connector.

FIG. 2 is a sectional view showing an example where the multi-chip module 1 is mounted on the electronic circuit substrate 2 with the use of a connecter 4. In the connector 4, respective terminals of the multi-chip module 1 are formed on plugs 4a, and respective terminals of the electronic circuit substrate 2 corresponding to each of these plugs 4a are formed on receptacles 4b. The respective terminals of the multi-chip module 1 may be formed on the receptacles 4b and the respective terminals of the electronic circuit substrate 2 may be formed on the plugs 4a. The connector 4 engages the respective plugs 4a with the respective receptacles 4b by depression of the multi-chip module 1 so that the multi-chip module 1 is fixed onto the electronic circuit substrate 2.

When the multi-chip module 1 is mounted on the electronic circuit substrate 2 with the use of such a socket as the hinge type of socket 3, the socket has to form the contact pins 5 corresponding to each terminal of the multi tip pins module 1. Thus, it is difficult to work and arrange the contact pins 5 with proper accuracy with respect to the terminal space of the multi-chip module 1 which is further refined. Also, when the terminal of the multi-chip module 1 increases in number, the parts of the socket increases in number to increase the assembling steps. Also, in the conventional socket, it is difficult to radiate heat to be generated from the LSI chip mounted on the multi-chip module 1. Also, when external terminals like the contact pins 5 to be connected to the electronic circuit substrate 2 increase in number in the conventional socket, it becomes difficult to control the curving condition, thus resulting in the difficult mounting operation thereof.

When the multi-chip module 1 is mounted on the electronic circuit substrate 2 with the use of the connector 4, the LSI chip to be connected with, for example, solder bump is to be given thermal stress in soldering. Also, when the multi-chip module 1 is mounted on the electronic circuit substrate 2 with the use of the connector 4, the substrate material, size of the multi-chip module 1, and the mounting position of the LSI chip to be loaded are restricted because of the mounting method of the connector 4 or the like.

Therefore, such proposals for solving problems as described hereinabove, disclosed in Japanese Patent Application Laid-Open No. 64-86540, Japanese Patent Application Laid-Open No. 64-89549 and Japanese Patent Application Laid-Open No. 63-305536, have following problems.

Since the connector pins each are formed separately, arrangement in refined pitch is hard to perform. Since the positioning operation is effected in the outer shape of a carrier for loading the chip on, it is impossible to apply to such refined terminal arrangement as the outer appearance size tolerance may exceed the arrangement pitch of the connector pin. The radiation effect cannot be expected, because the heat radiation from the carrier with chip being loaded on is not considered. The assembling operation is difficult to perform, because the connector pin increases when the terminal of the carrier with chips being loaded on is increased.

SUMMARY OF THE INVENTION

One object of the present invention is to provide a socket for electronic components, and an electronic component with a socket for connection, where part items do not increase in number when the number of contact terminals increases, heat stress does not arise with respect to the internal electronic components in soldering, and the curving condition of the external terminal to be connected to the electronic circuit substrate is not required to be controlled.

Another object of the present invention is to provide a socket for electronic components, and an electronic component with a socket for connection, which can be used even when the outer size tolerance of the electronic component is large, and the electronic component is electrically required to be insulated from the socket main body.

Still another object of the present invention is to provide a socket for electronic components, and an electronic component with a socket for connection, which can be positively connected with terminals or can be easily exchanged positively even when the terminals of the electronic component are many and refined.

A further object of the present invention is to provide a socket for electronic components, and an electronic component with a socket for connection, where heat from the electronic component can be radiated effectively.

The socket for electronic components of the present invention has a frame for engaging an electronic component; a film-shaped connector which is retained by the frame and which has a first terminal to be connected to the terminal of the electronic component, a second terminal to be connected to the terminal of an electronic circuit substrate, and a wiring for electrically connecting the first terminal with the second terminal; and a cover mounted on the frame to cover the electronic component for bringing the terminal of the electronic component into contact with the first terminal.

In the socket for electronic components, the frame engages the electronic component. The respective terminals of the engaged electronic component are electrically connected with the respective terminals of the electronic circuit substrate by the respective wirings of the film-shaped connector. The respective terminals of the electronic component and the respective wirings of the film-shaped connector are connected by depressing the respective terminals of the electronic component and the respective first terminals, when the cover is mounted on the frame. Thus, if the number of contact terminals increases, the number of parts items does not increase with the number of wirings of the film-shaped connector being increased. Further, the curving condition of the second terminal to be connected to the electronic circuit substrate is not required to be controlled.

In the above described socket for electronic components, a carrier for mounting and retaining the electronic component is provided, and the frame engages the electronic component through the carrier. Namely, the carrier mounts and retains the electronic component, and the frame indirectly engages the electronic component mounted and retained on the carrier. Even when the outer shape size tolerance of the electronic component is large, or the outer shape of the electronic component is thin, the electronic component can be engaged with the socket, or the electronic component can be electrically insulated.

In the above described socket for electronic components, the frame has a spring member which is provided on the corner of the frame and depresses the electronic component, and a plurality of adjusters, provided on two sides of the frame opposite to the corner, which have a screw and a plunger for converting the moving direction of the screw into the direction for adjusting the position of the electronic component, and which depress the electronic component against the spring member to adjust the position of the electronic component. The tip end scraped on the conical stand of the screw pushes the plunger to move when the screw rotates and moves within the tapped hole of the screw provided in the frame. The plunger which is pushed and moved, depresses the electronic component in the direction of the spring member. Such adjusters are provided on two sides of the frame opposite to the corner where the spring member is provided, and the position of the electronic component is adjusted. Thus, the terminal can be connected positively even if the terminals of the electronic component are many and refined. Also, the electronic component can be exchanged positively and easily.

In the above described socket for electronic components, the cover has a heat radiating portion for radiating the heat to be generated from the electronic component, and a heat transferring portion for contacting to the electronic component to transfer the heat to the heat radiating portion. The heat transferring portion of the cover transfers to the heat radiating portion the heat to be generated from the electronic component by the contact with the electronic component so that the heat radiating portion radiates the heat. Thus, the heat from the electronic component can be effectively radiated.

The above and further objects and features of the invention will be more fully apparent from the following detailed description with accompanying drawings.

DESCRIPTION OF THE PREFERRED EMBODIMENTS

The present invention will be described hereinafter in accordance with the embodiments.

Figure 3:
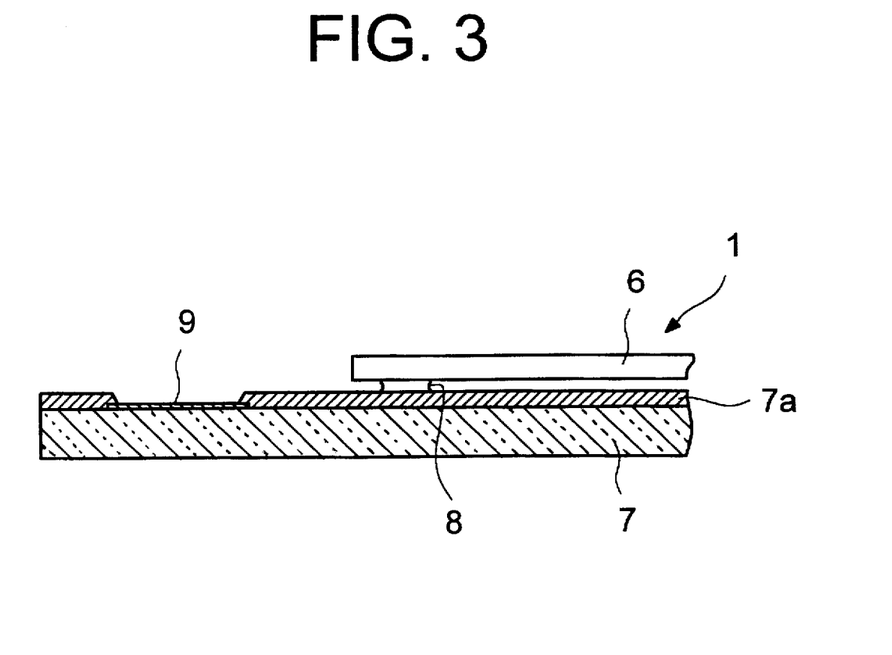
FIG. 3 is a partial sectional view showing an essential portion construction of the multi-chip module to be loaded on a socket for electronic components use of the present invention.

FIG. 3 is a partial sectional view showing the essential portion construction of the multi-chip module 1 which is an electronic component to be mounted on the socket for electronic components. The substrate 7 of the multi-chip module 1 is a multi layer wiring substrate, with electric wirings 7a being formed of many layers, on silicon crystals, glass or on a plate made of metal such as aluminum or the like. An LSI chip 6 mounted with flip chip bonding or the like is connected with the electric wiring 7a of the substrate 7 through a bump electrode 8 for connection use. Also, there is provided a terminal 9, on the external edge portion of the upper portion of the substrate 7, for connecting the electric wiring 7a of the substrate 7 to the terminal (not shown) of an electronic circuit substrate outside the multi-chip module 1.

Figure 4:
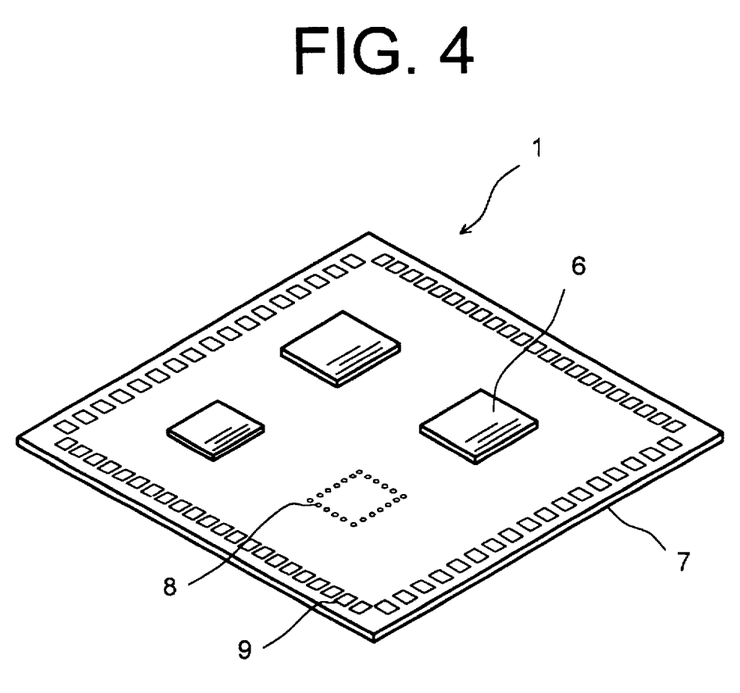
FIG. 4 is a perspective view showing the outer shape of the multi-chip module.

FIG. 4 is a perspective view showing the outer shape example of such a multi-chip module 1. The multi-chip module 1 has three LSI chips 6 mounted on the upper side of the substrate 7 with many terminals 9 being provided on the external edge portion of the upper portion of the substrate 7. Bump electrodes 8 for connection use arranged on a square can be seen in an empty space wherein the LSI chip 6 is not mounted.

Figure 5:
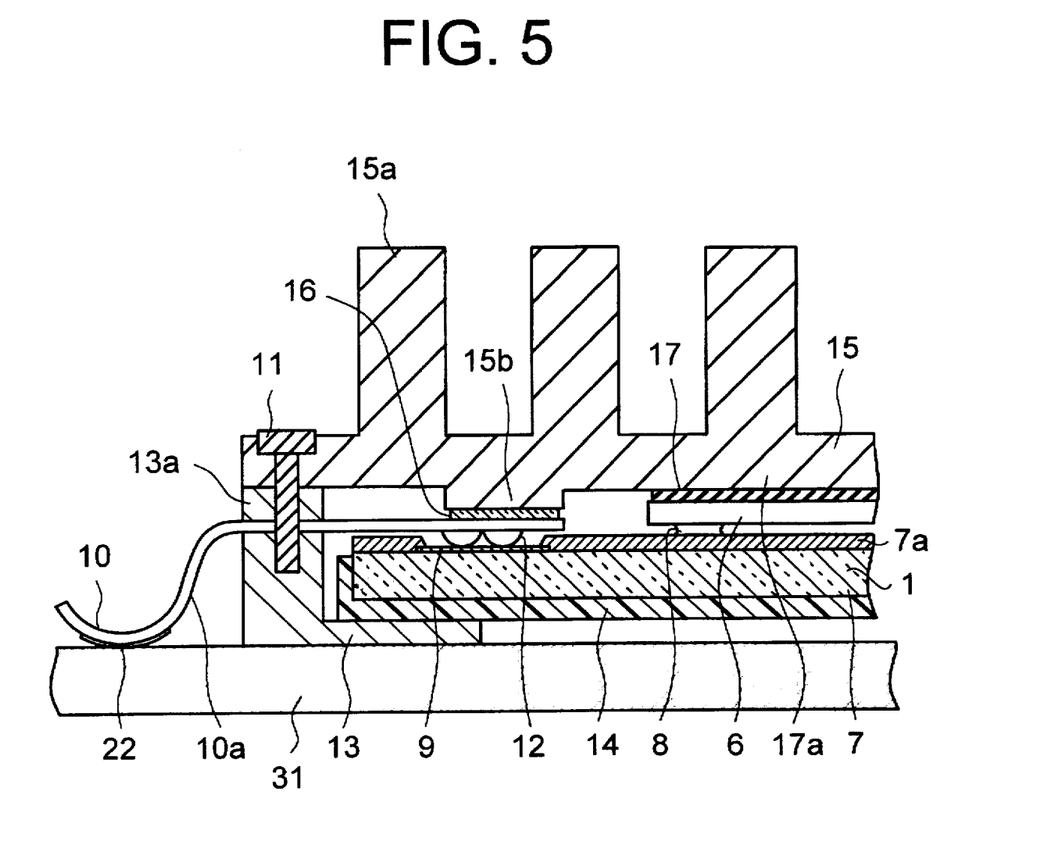
FIG. 5 is a partial sectional view showing an essential portion construction in a condition where the multi-chip module is mounted on the socket for electronic components of the present invention.

FIG. 5 is a partial sectional view showing the essential portion in a condition where the multi-chip module 1 is mounted on the socket for electronic components. The substrate 7 of the multi-chip module 1 is mounted on a carrier 14 engaged with a frame 13 of the socket for electronic components. As described hereinabove, the LSI chip 6 is connected through the bump electrode 8 for connection use with the electric wiring 7a of the substrate 7 of the multi-chip module 1 with the terminal 9 being provided on the upper portion of the substrate 7. The bump 12 of a film-shaped connector 10 is in contact with the terminal 9.

The film-shaped connector 10 is grasped between the frame 13 and a frame member 13a superposed on the frame 13, and is secured with a stationary screw (see FIG. 7) 11a screwed into the tapped hole of the frame 13 through the frame member 13a and the film-shaped connector 10. The film-shaped connector 10 may be directly bonded with the frame 13 or no frame member 13a may be provided in this case.

Figure 6:
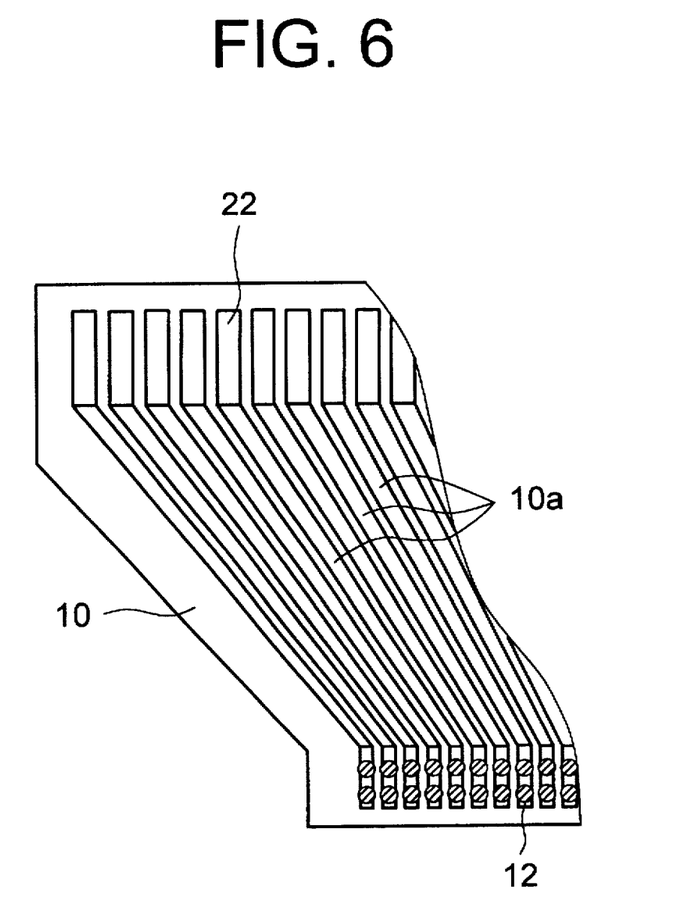
FIG. 6 is a view showing in detail a portion of a film-shaped connector.

FIG. 6 is a view showing in detail one portion of the film-shaped connector 10. The film-shaped connector 10 is produced as a base material which is made of heat-proof, insulating material quality such as polyimide or the like with metallic sheet of copper or the like being pasted on the surface. An etching process applies to the metallic sheet on the surface in order to form a first terminal, a second terminal (an external terminal 22), and a wiring for every terminal 9. On the first terminal, one bump or a plurality of bumps 12 (are formed) for electrically connecting to the multi-chip module 1. The external terminal 22 (second terminal) is for soldering to the terminal (not shown) of the electronic circuit substrate 31 outside the socket for electronic components, and a wiring 10a is for electrically connecting the bump 12 and the external terminal 22 corresponding to the bump 12.

The size and interval of the bump 12 are formed in accordance with the size and interval of the terminal 9 of the multi-chip module 1. The size and interval of the external terminal 22 are formed in accordance with the size and interval of the terminal of the electronic circuit substrate made larger for easier wiring operation. The bump 12 is constructed for better contact with the terminal 9 with tungsten or the like being evaporated to metallic core such as copper or the like. Since the external terminal 22 is constructed on the film, it is strong against shift of the terminal pitch, the terminal curve or the like to be caused by external force, thus allowing positive soldering operation to be effected.

A cover 15 of the socket for electronic components is mounted on the frame 13, with a stationary screw 11 screwed into the tapped hole of the frame 13 through the frame member 13a and the film-shaped connector 10, to cover the frame 13 and the multi-chip module 1. The cover 15 has a depressing portion 15b, where an elastic sheet 16 is pasted on it, on the opposite face on the side of the multi-chip module 1 for obtaining the stable electric contact in contact with the bump 12 and the terminal 9. Thus, better electric contact can be obtained by the controlling of the clamping torque of the stationary screw 11.

Also, the cover 15 is provided with a heat radiating portion 15a for radiating heat to be generated from the LSI chip 6 of the multi-ship module 1, and a heat transferring portion 17a where a heat conducting sheet 17 which comes into contact with the LSI chip 6 for conducting to the heat radiating portion 15a the heat to be generated from the LSI chip 6 is pasted. The heat conducting sheet 17, made of silicon rubber higher in heat conductivity and having elasticity, absorbs dispersion on the height of the LSI chip 6 for effective thermal combination between the LSI chip 6 and the heat transferring portion 17a of the cover 15. Also, the cover 15 is also made of metal or the like superior in thermal conductivity, thus contributing towards realization of the heat radiation characteristics.

Figure 7:
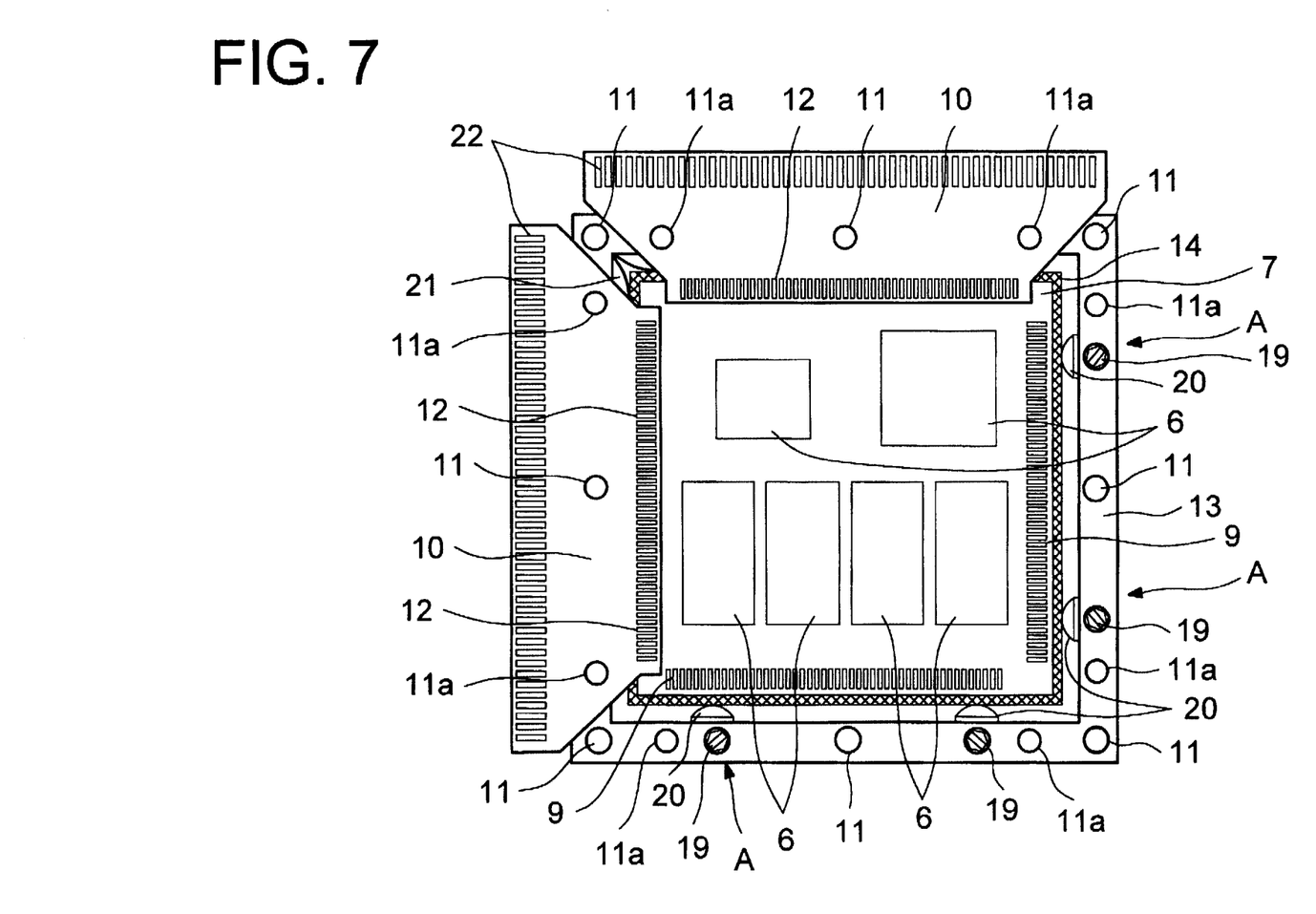
FIG. 7 is a top face view of a condition shown in FIG. 5.

FIG. 7 is a top face view in a condition where the multi-chip module 1 is mounted. For illustrating of the inner construction, the two side portion of the film-shaped connector 10 to be arranged on four sides of the socket for electronic components is omitted. Also, for the same reason, the frame member 13a and the cover 15 for fixing to the frame 13 the film-shaped connector 10 are also omitted.

A carrier 14 mounting and retaining the substrate 7 of the multi-chip module 1 is engaged in the center of the frame 13. The carrier 14 is adjusted in positioning for the accurate position by a positioning spring 21 (spring member) provided on one corner of the frame 13, and an adjuster A provided respectively by two on two sides of the frame 13 opposite to the positioning spring 21. The multi-chip module 1 is inserted and drawn out with each carrier 14 by bending the film-shaped connector 10 externally of the socket for electronic components. The stationary screw 11 is disposed on both the ends and the central points of four sides of the frame 13.

Figure 8:
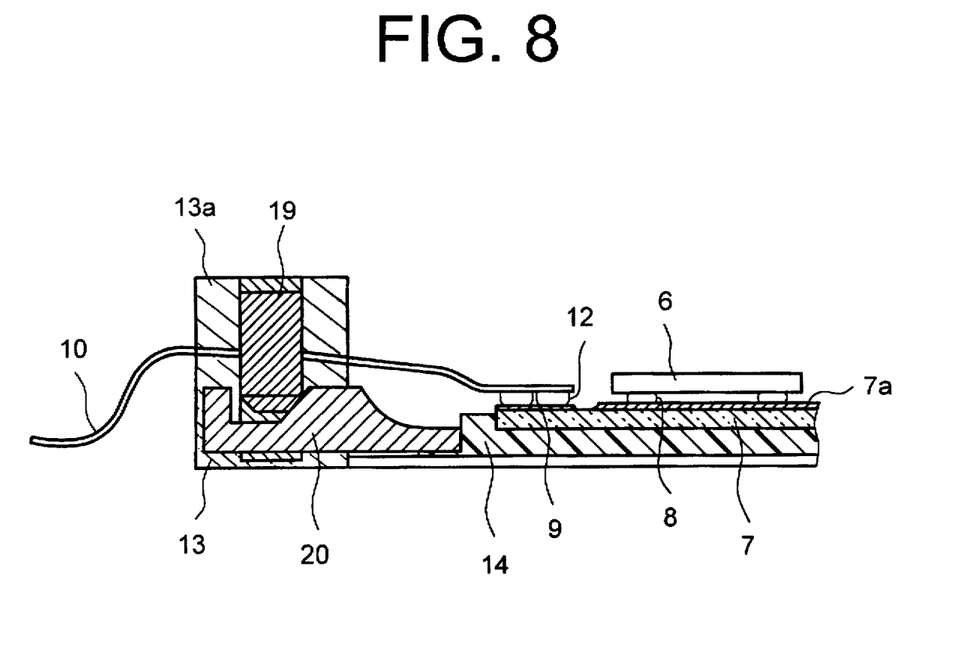
FIG. 8 is a sectional view showing an essential portion construction example of an adjuster.

FIG. 8 is a sectional view showing the essential portion construction of the adjuster A. The adjuster A has a screw 19 screwed into a precise tapped hole provided in the frame 13. The tip end of the screw 19 is machined into a truncated cone shape with the tip end of the screw 19 being in contact with the plunger 20. As shown in FIG. 7, the tip end of the plunger 20 is worked into a circular arc and in spot contact with the carrier 14. The screw 19 moves in a vertical direction by turning the screw 19 to move the plunger 20 in a horizontal direction. Thus, the plunger 20 depresses the carrier 14 in a direction of the positioning spring 21 shown in FIG. 7 to adjust the positioning for correct position. The carrier 14 is properly depressed even by the positioning spring 21 to hold the play of the plunger 20. Four adjusters A arranged on two sides of the frame 13 are respectively controlled to also allow the carrier 14, through microrotation needless to say the movement in longitudinal and latitudinal directions.

Figure 9:
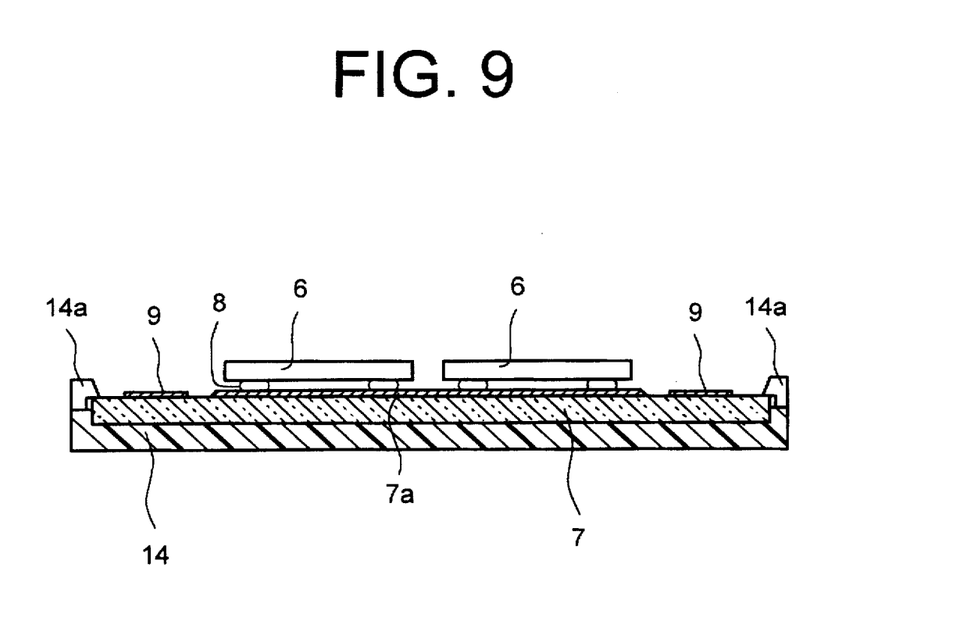
FIG. 9 is a sectional view showing one example of a carrier for mounting and retaining the multi-chip module.

FIG. 9 is a sectional view showing one example of the carrier 14 for mounting and retaining the multi-chip module 1. The carrier 14 is used when the multi-chip module 1 is so thin that the adjuster A of the socket for electronic components according to the present invention does not work and when the multi-chip module 1 is electrically required to be insulated. The carrier 14 of FIG. 9 is made of plastic. The multi-chip module 1 is fixed by light external bending of a stationary hook 14a provided on opposite two sides to engage the multi-chip module 1.

Figure 10:
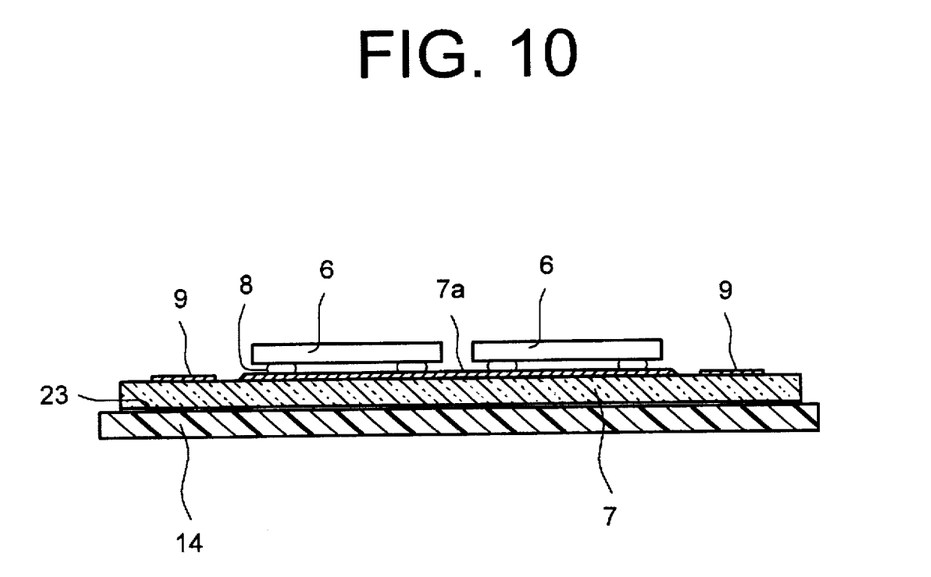
FIG. 10 is a sectional view showing another example of the carrier for mounting and retaining the multi-chip module.

FIG. 10 is a sectional view showing another example of the carrier 14 for mounting and retaining the multi-chip module 1. The carrier 14 which is a bonding sheet 23 mounted on the flat plate material, has the multi-chip module 1 fixedly bonded on it. Since the outer shape of the carrier 14 in this case is worked with good precision, the adjuster A is not necessarily required by the correct bonding in position of the terminal 9 of the multi-chip module 1 and the carrier 14.

In the present invention, the carrier 14 is not essential. The carrier 14 is not necessary to use because of the direct engagement of the multi-chip module 1 with the frame 13 when the outer shape size of the multi-chip module 1 is sufficiently correct.

As this invention may be embodied in a several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A socket for electrically connecting a terminal of an electronic component with a terminal of an electronic circuit substrate, comprising:

a frame for engaging the electronic component;

a film-shaped connector, retained by the frame, having a first terminal for connection with the terminal of the electronic component, a second terminal for connection with the terminal of the electronic circuit substrate, and a wiring for electrically connecting the first terminal with the second terminal;

a cover, mounted on the frame, for covering the electronic component, and for making the terminal of the electronic component come into contact with the first terminal;

the frame including:
a spring member provided on a first corner of the frame, for applying force against the electronic component; and a plurality of adjusters provided on two sides of the frame, said two sides joining at a second corner which is opposite to said first corner, wherein each said adjuster has a screw which is adjustable from an upper face of the frame to advance the screw in a moving direction, and each said adjuster includes a plunger for converting the moving direction of the screw to another moving direction for adjusting the position of the electronic component and for pressing the electronic component against the spring member.

2. A socket in accordance with claim 1, wherein the carrier includes a hook at at least two of its end portions for securing the electronic component to the carrier.

3. A socket in accordance with claim 1, wherein the carrier has a bonding sheet on its face for mounting the electronic component.

4. A socket in accordance with claim 1, further comprising:
a carrier for mounting and retaining the electronic component;
wherein the frame engages the electronic component through the carrier, and the adjusters press the electronic component against the spring member through the carrier to adjust the position of the electronic component.

5. A socket in accordance with claim 1, wherein the electronic component is a multi-chip module.

6. A socket in accordance with claim 1, wherein the cover has:
a heat radiating portion for radiating heat generated from the electronic component; and
a heat transferring portion for contacting the electronic component to transfer heat to the heat radiating portion.

7. A socket in accordance with claim 6, wherein:
the heat transferring portion has a heat transferring sheet made of silicon rubber in contact with the electronic component.

8. An electronic component with a socket for engaging the electronic component, where the electronic component is electrically connected to a terminal of an electronic circuit substrate, comprising:
an electronic component having a terminal electrically connected to the terminal of the electronic circuit substrate;
a frame for engaging the electronic component;
a film-shaped connector, retained by the frame, having a first terminal connected to the terminal of the electronic component, a second terminal connected to the terminal of the electronic circuit substrate, and a wiring for electrically connecting the first terminal with the second terminal;
a cover, mounted on the frame, for covering the electronic component, and for making the terminal of the electronic component come into contact with the first terminal;

wherein the frame includes:
a spring member provided on a first corner of the frame, for applying force against the electronic component; and a plurality of adjusters provided on two sides of the frame, said two sides joining at a second corner which is opposite to said first corner, wherein each said adjuster has a screw which is adjustable from an upper face of the frame to advance the screw in a moving direction, and each said adjuster includes a plunger for converting the moving direction of the screw to another moving direction for adjusting the position of the electronic component and for pressing the electronic component against the spring member.

9. An electronic component with a socket in accordance with claim 8, wherein the electronic component is a multi-chip module.

10. An electronic component with a socket in accordance with claim 8, further comprising:
a carrier for mounting and retaining the electronic component;
wherein the frame engages the electronic component through the carrier, and the adjusters press the electronic component against the spring member through the carrier to adjust the position of the electronic component.

11. An electronic component with a socket in accordance with claim 8, wherein the cover has:
a heat radiating portion for radiating heat generated from the electronic component; and
a heat transferring portion for contacting the electronic component to transfer heat to the heat radiating portion.

12. A socket for receiving an electronic component, comprising:
a frame for engaging the electronic component, wherein said frame includes a first, second, third and fourth sides;
a spring member located in proximity to a corner of the frame for applying force to said electronic component, wherein said corner is formed by a connection of the first and second sides;
at least one adjuster located on at least one of the sides, wherein said at least one adjuster comprises:
a screw for insertion into a hole formed in a top face of the frame, wherein the screw is accessible to a user from the top face of the frame for adjustment of the screw, wherein said screw advances in a first direction in response to adjustment by the user; and
a plunger for engaging said screw at one end of said plunger and for engaging said electronic component at an opposite end of said plunger, wherein movement of said screw in said first direction advances said plunger in a second direction, wherein said second direction is substantially perpendicular to said first direction;
wherein movement of said plunger in said second direction causes movement of said electronic component against the force established by the spring member.

* * * * *